(12) United States Patent
Madadi et al.

(10) Patent No.: US 9,014,653 B2
(45) Date of Patent: Apr. 21, 2015

(54) HIGH-IF SUPERHETERODYNE RECEIVER INCORPORATING HIGH-Q COMPLEX BAND PASS FILTER

(71) Applicant: Technische Universiteit Delft, Delft (NL)

(72) Inventors: Iman Madadi, Delft (NL); Massoud Tohidian, Delft (NL); Robert Bogdan Staszewski, Delft (NL)

(73) Assignee: Technische Universiteit Delft, Delft (NL)

( * ) Notice: Subject to any disclaimer, the term of this patent is extended or adjusted under 35 U.S.C. 154(b) by 74 days.

(21) Appl. No.: 14/027,849

(22) Filed: Sep. 16, 2013

(65) Prior Publication Data

US 2014/0080436 A1    Mar. 20, 2014

Related U.S. Application Data

(60) Provisional application No. 61/701,690, filed on Sep. 16, 2012, provisional application No. 61/701,695, filed on Sep. 16, 2012, provisional application No. 61/704,522, filed on Sep. 23, 2012, provisional application No. 61/829,976, filed on May 31, 2013.

(51) Int. Cl.
*H04B 1/26* (2006.01)
*H03L 7/00* (2006.01)
*H03B 7/06* (2006.01)
*H04B 1/10* (2006.01)
*H03B 5/12* (2006.01)
*H03L 7/099* (2006.01)

(52) U.S. Cl.
CPC .. *H03L 7/00* (2013.01); *H03B 7/06* (2013.01); *H04B 1/10* (2013.01); *H04B 1/26* (2013.01); *H03B 5/1228* (2013.01); *H03B 5/1296* (2013.01); *H03B 5/1215* (2013.01); *H03B 5/124* (2013.01); *H03L 7/099* (2013.01)

(58) Field of Classification Search
USPC ......... 455/130, 296, 307, 313, 324, 325, 334, 455/339; 375/261, 319, 343, 344, 346
See application file for complete search history.

(56) References Cited

U.S. PATENT DOCUMENTS

| | | | |
|---|---|---|---|
| 6,356,746 B1 * | 3/2002 | Katayama | 455/324 |
| 2005/0123072 A1 * | 6/2005 | Guimaraes | 375/319 |
| 2007/0268978 A1 * | 11/2007 | Kazakevich et al. | 375/261 |
| 2009/0225911 A1 * | 9/2009 | Elahi et al. | 375/346 |

* cited by examiner

*Primary Examiner* — Thanh Le
(74) *Attorney, Agent, or Firm* — Zaretsky Patent Group PC; Howard Zaretsky

(57) ABSTRACT

A novel and useful reconfigurable superheterodyne receiver that employs a $3^{rd}$ order complex IQ charge-sharing bandpass filter (BPF) for image rejection and $1^{st}$ order feedback based RF BPF for channel selection filtering. The operating RF input frequency of the receiver is 500 MHz to 1.2 GHz with a varying high IF range of 33 to 80 MHz. The gain stages are inverter based $g_m$ stages and the total gain of the receiver is 35 dB and in-band IIP3 at mid gain is +10 dBm. The NF of the receiver is 6.7 dB which is acceptable for the receiver without an LNA. The architecture is highly reconfigurable and follows the technology scaling.

21 Claims, 15 Drawing Sheets

HIGH-IF SUPERHETERODYNE RECEIVER INCORPORATING HIGH-Q COMPLEX BAND PASS FILTER

REFERENCE TO PRIORITY APPLICATIONS

This application claims priority to U.S. Provisional Application Ser. No. 61/701,690, filed Sep. 16, 2012, entitled "Digitally Intensive Transceiver," U.S. Provisional Application Ser. No. 61/701,695, filed Sep. 16, 2012, entitled "Class-F Oscillator," U.S. Provisional Application Ser. No. 61/704,522, filed Sep. 23, 2012, entitled "RF Transceiver," and U.S. Provisional Application Ser. No. 61/829,976, filed May 31, 2013, entitled "Time Domain RF Signal Processing," all of which are incorporated herein by reference in their entirety.

FIELD OF THE INVENTION

The present invention relates to the field of semiconductor integrated circuits and more particularly relates to a high-IF superheterodyne receiver incorporating high-Q complex band pass filter (BPF).

BACKGROUND OF THE INVENTION

Radio frequency (RF) receivers (RX) are well-known in the electrical art. Integrated RF receivers are typically zero-IF or low-IF (i.e. homodyne) because of the well-known benefits, including a high-level of integration, the ability to use low-pass filtering for channel selection and the avoidance of an external IF band-pass filter (BPF). Weak desired signals are typically accompanied by large blocking interferers. These blockers can dramatically degrade the receiver performance by causing gain compression and higher-order nonlinearities as well as increasing noise figure (NF) of the receiver. Conventionally, these out-of-band blockers are filtered out by a bulky and expensive SAW filter placed before the input to the low noise amplifier (LNA). Since the desired RF signal could be weak and the dynamic range requirements of a given specification must be met, the gain of the LNA should be kept high and the blockers should be filtered out. Otherwise, the mixer and the following stages could get saturated. SAW-less receivers are known in the art. Prior art SAW-less receivers are based on a homodyne architecture. Unfortunately, they all exhibit well-known homodyne RX issues such as sensitivity to 1/f noise and varying dc offsets, finite IIP2, all of which get worse with the inevitable scaling of the process technology.

There is thus a need for a SAW-less receiver architecture that is highly integrated, does not suffer from the disadvantages of prior art receivers and effectively filters blocking interferer signals.

SUMMARY OF THE INVENTION

A novel and useful reconfigurable superheterodyne receiver that employs a $3^{rd}$ order complex IQ charge-sharing band-pass filter (BPF) for image rejection and $1^{St}$ order feedback based RF BPF for channel selection filtering. The operating RF input frequency of the receiver is 500 MHz to 1.2 GHz with varying high IF range of 33 to 80 MHz. The gain stages are inverter based $g_m$ stages and the total gain of the receiver is 35 dB and in-band IIP3 at mid gain is +10 dBm. The NF of the receiver is 6.7 dB which is acceptable for the receiver without an LNA. The architecture is highly reconfigurable and follows the technology scaling. In one embodiment, the RX occupies 0.47 mm$^2$ of active area and consumes 24.5 mA at 1.2V power supply voltage.

There is thus provided in accordance with the invention, a superheterodyne radio frequency (RF) receiver, comprising an RF input node for receiving an RF input signal, a local oscillator (LO) input node for receiving an LO signal, a mixer coupled to said RF input node and said LO input node, said mixer operative to frequency translate said RF input signal in accordance with said LO signal, said mixer producing an in-phase/quadrature (I/Q) intermediate frequency (IF) signal of frequency substantially higher than a bandwidth of said RF input signal, a band pass discrete-time (DT) IF filter coupled to said IF signal, wherein said band pass DT IF filter presents an input impedance that is substantially higher at higher frequency offsets from said IF frequency than at lower frequency offsets from said IF frequency.

There is also provided in accordance with the invention, a superheterodyne radio frequency (RF) receiver, comprising an RF input node for receiving an RF input signal, a local oscillator (LO) input node for receiving an LO signal, a mixer coupled to said RF input node and said LO input node, said mixer operative to frequency translate said RF input signal in accordance with said LO signal, said mixer producing an in-phase/quadrature (I/Q) intermediate frequency (IF) signal of frequency substantially higher than a bandwidth of said RF input signal, a discrete time (DT) band pass filter coupled to said IF signal and operative to filter out blocking interferer signals and image components of the desired signal, a notch filter coupled to the output of said band pass filter and operative to reject wanted signals and pass all blocker and unwanted signals, and a feedback loop operative to feedback the output of said notch filter to the input of said band pass filter.

There is further provided in accordance with the invention, a superheterodyne radio frequency (RF) receiver, comprising an RF input node for receiving an RF input signal, a local oscillator (LO) input node for receiving an LO signal, a mixer coupled to said RF input node and said LO input node, said mixer operative to frequency translate said RF input signal in accordance with said LO signal, said mixer producing an in-phase/quadrature (I/Q) intermediate frequency (IF) signal of frequency substantially higher than a bandwidth of said RF input signal, a complex IQ charge sharing discrete time (DT) band pass filter centered at said IF coupled to said IF signal and operative to filter out blocking interferer signals and images of the desired signal, a complex notch filter coupled to the output of said band pass filter and operative to reject wanted signals and pass all blocker and unwanted signals, and a transconductance feedback path operative to feed the output of said notch filter back to the input of said band pass filter.

BRIEF DESCRIPTION OF THE DRAWINGS

The invention is herein described, by way of example only, with reference to the accompanying drawings, wherein.

DETAILED DESCRIPTION OF THE INVENTION

Figure 1:
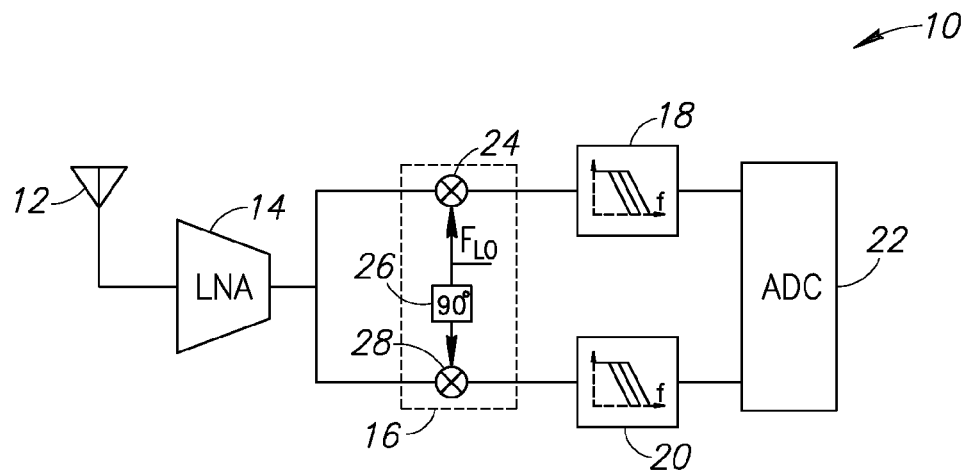
FIG. 1 is a high level block diagram illustrating an example homodyne receiver architecture.

A high level block diagram illustrating an example homodyne receiver architecture is shown in FIG. 1. The receiver, generally referenced 10, comprises an antenna 12 coupled to a low noise amplifier (LNA) 14. The output of the LNA is input to a mixer 16 that multiplies (24, 28) the input signal with sin and cos (via 90 degree shifter 26) versions of a local oscillator at frequency $F_{LO}$. The mixer products are low pass filtered (18, 20) and converted to digital form (22) for further baseband processing including demodulation and decoding.

Homodyne receivers such as shown in FIG. 1 have several disadvantages such as sensitivity to 1/f noise and varying dc offsets, finite IIP2, all of which worsen with the scaling of the process technology.

In another embodiment, a superheterodyne receiver of high-IF is provided that overcomes the disadvantages of homodyne receivers. In one embodiment, an integrated superheterodyne RX is operative to filter the blockers through an N-path filter, as opposed to a discrete time filtering approach. An image folding issue, however, is not addressed by this architecture. In another embodiment, image folding issues are solved through use of a discrete-time (DT) charge-sharing filtering technique. The interferer blockers are filtered through a feedback based high-Q RF band pass filter (BPF). The architecture is process scalable and highly reconfigurable.

The N-path filters offer high-Q BFP filtering with precise control of the center frequency through clock adjustment. Despite a very high-Q filtering, N-path filters provide only around 7 to 16 dB of filtering rejection due to the poor switch on-resistance in mixers. On the other hand, this type of filter suffers from folding of images from $(N-1)f_{IF}$ and $(N+1)f_{IF}$ with a normalized gain proportional to $1/(N+1)$ and $1/(N-1)$. For example, the images of the 16-path filter fold onto the wanted signal via 24 dB attenuation, which does not appear sufficient. Therefore, it is preferable to use pre-filtering (i.e. pre-select, SAW, N-path, etc.) to remove the images, which degrade the receiver noise figure (NF) and cause image folding. Usually, the gain of an LNA is around 10 to 20 dB, which can saturate the output of an LNA in the presence of a blocker that can be as large as 0 dBm (600 mV p-p). Therefore, in order to prevent saturation, the BPF is placed immediately after the LNA to attenuate the blockers.

Figure 2:
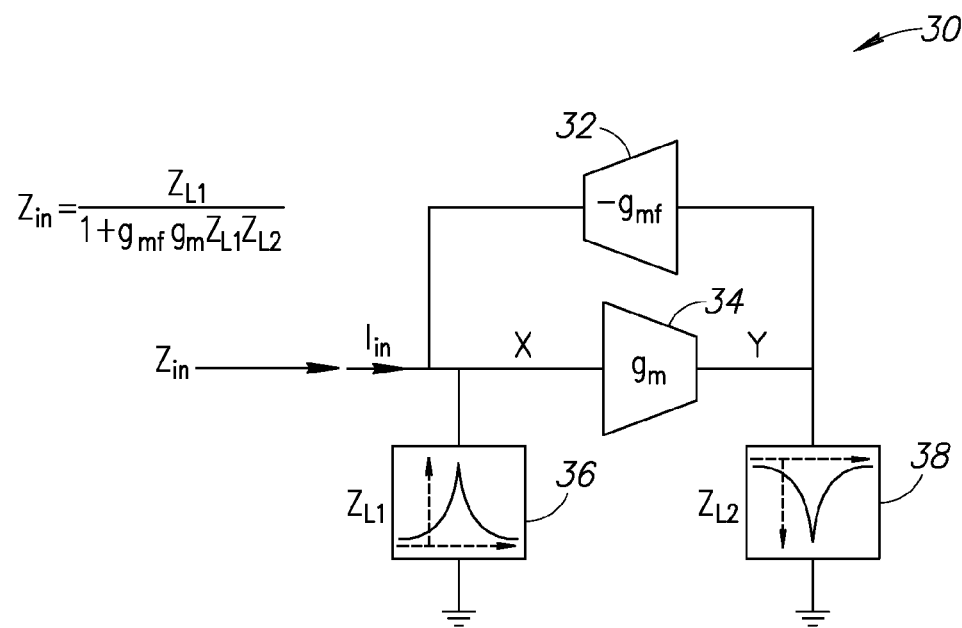
FIG. 2 is a high level block diagram illustrating example impedance combinations.

The novel idea of the high-Q RF BPF comes from a combination of two types of impedances. As shown in FIG. 2, the input current $I_{in}$ is converted to voltage at node X through multiplication by $Z_{L1}$ 36. Then, it is converted to current and sinked on $Z_{L2}$ 38. The resulting voltage $V_Y$ gets fed back to input node $V_X$ by a transconductance 32 in the feedback path. As shown in FIG. 2, the input impedance of the circuit is $Z_{L1}/(1+g_{mf}g_m Z_{L1} Z_{L2})$. When the gain $g_{mf} g_m Z_{L1} Z_{L2}$ is smaller than unity, the input impedance is equal to $Z_{L1}$ which in this embodiment occurs at frequencies far from the wanted signal. On the other hand, the input impedance becomes $1/(g_{mf} g_m Z_{L2})$ in the case that $g_{mf} g_m Z_{L1} Z_{L2}$ is much larger than unity which happens at frequencies very close to the desired signal. In one embodiment, the first impedance $Z_{L1}$ comprises a $3^{rd}$ order complex IQ charge-sharing filter which functions as a wide-bandwidth BPF centered at $+f_{IF}$ to filter out images of the wanted signal.

Figure 3A:
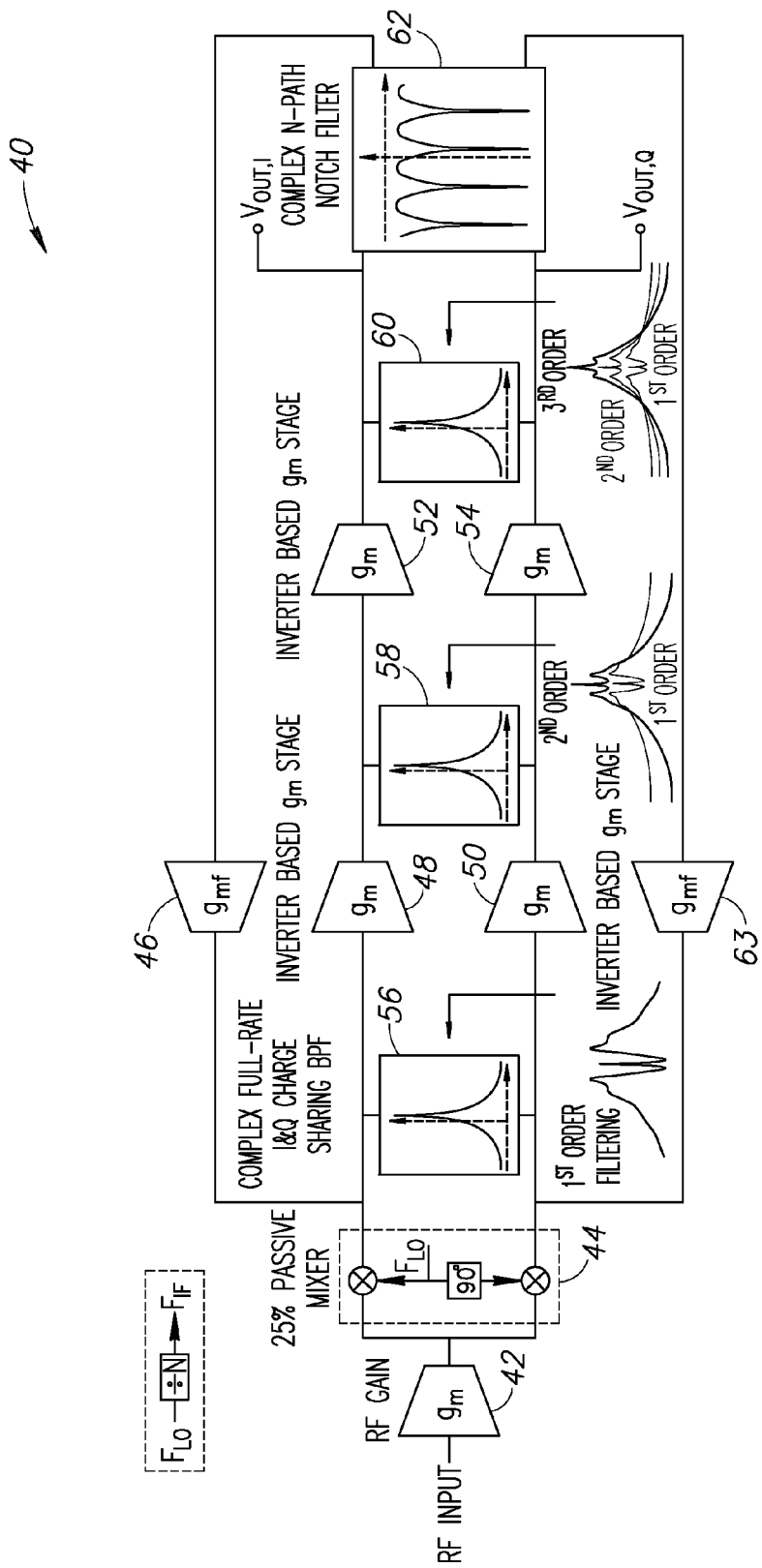
FIG. 3A is a block diagram illustrating an example embodiment of the high-IF receiver with high-Q BPF.
Figure 3B:
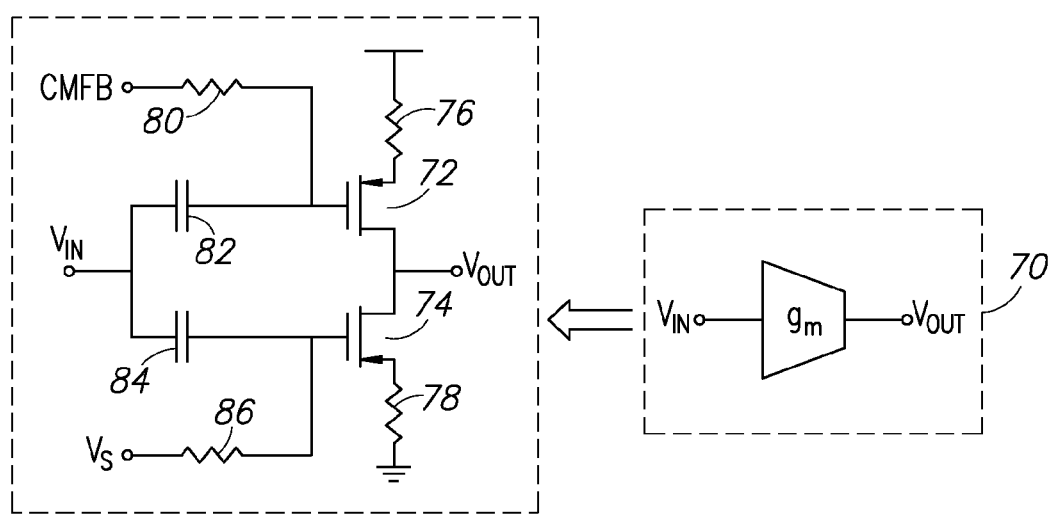
FIG. 3B is a schematic diagram illustrating an example gm cell in more detail.

A block diagram illustrating an example embodiment of the high-IF receiver with high-Q BPF is shown in FIG. 3A. A schematic diagram illustrating an example $g_m$ cell in more detail is shown in FIG. 3B. The receiver, generally referenced 40, comprises $g_m$ cells 42, 48, 52, 50, 54, $g_{mf}$ feedback cells 46, 63, mixer 44 BPF 56, 58, 60 and notch filter 62. The $g_m$ cell 70 comprises p-channel FET 72, N-channel FET 74, resistors 76, 78, 80, 86 and capacitors 82, 84.

In one embodiment, the second impedance $Z_{L2}$ comprises a complex 8-path notch filter that achieves a very sharp high-Q BPF at RF through a feedback path. FIG. 3A illustrates a detailed construction of a low impedance node after the RF mixer for blockers with extra filtering at image frequencies. Input matching of the circuit is provided by the input 50 Ohm resistance.

Figure 4:
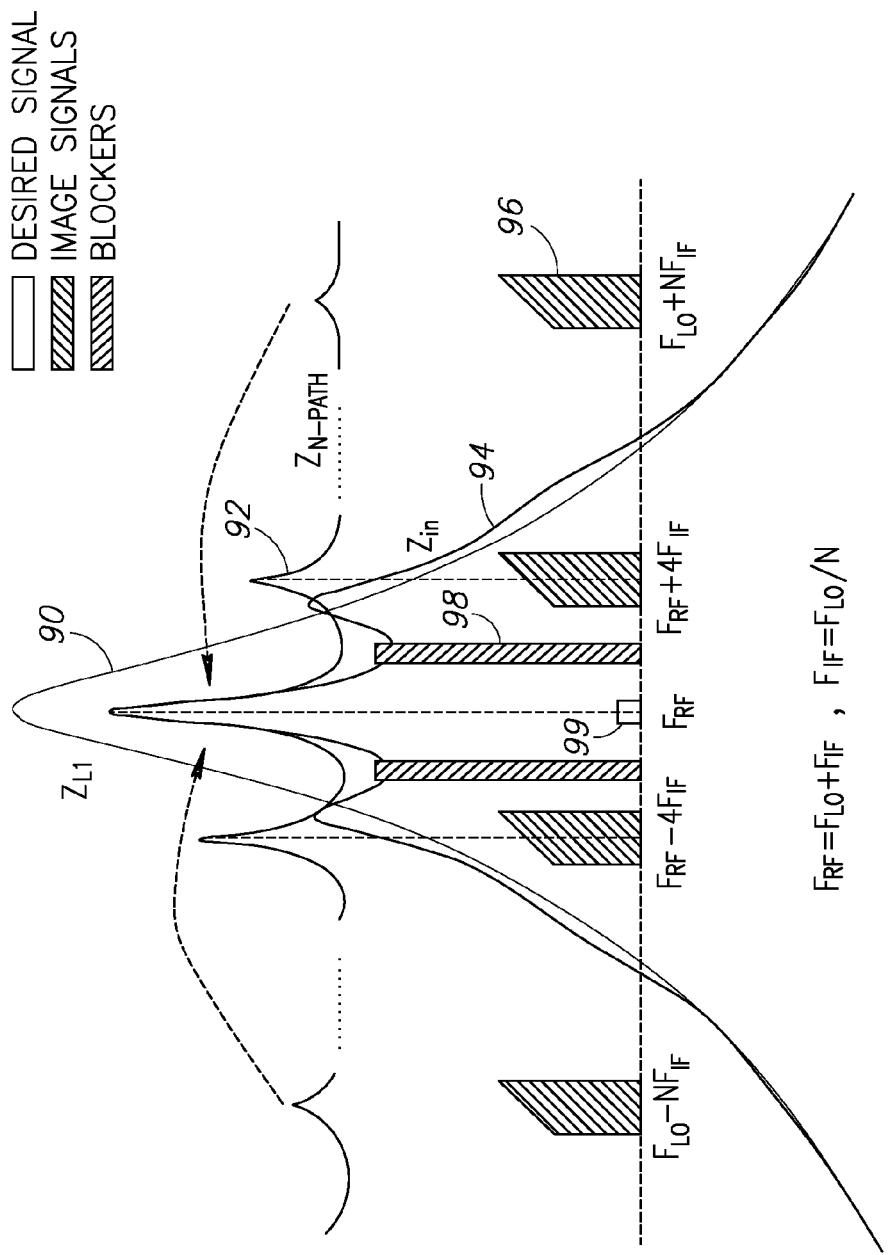
FIG. 4 is a diagram illustrating the frequency translation of the high-IF receiver compared to a typical N-path filter.

First, the RF input signal is converted to a current using an inverter based $g_m$ stage followed by a 25% passive mixer clocked at $f_{LO}$. The complex output current of the mixer requires a complex low-impedance node for blockers to eliminate the saturation of the $g_m$ output. A diagram illustrating the frequency translation of the high-IF receiver compared to a typical N-path filter shown in FIG. 4. As shown, the blockers 98 are attenuated because of the complex high-Q BPF while the complex full-rate wideband IQ charge sharing BPF 56 (including the feedback) rejects other image components 96, including those components at $-f_{IF}$. The filtered complex signals go through two similar wideband IQ filters 58. 60 for more attenuation of the images and amplification of the wanted signal. Output signals of the last (third) IQ filter 60 go through a complex notch filter 62 centered at $+f_{IF}$ followed by transimpedance amplifiers (TIA) 46. 63 in order to feed back the complex signals to the mixer output. The complex notch filter 62 rejects the wanted signal and passes all blockers and unwanted signals which get fed back through a transconductance ($g_{mf}$) and are canceled at the mixer output.

Figure 5:
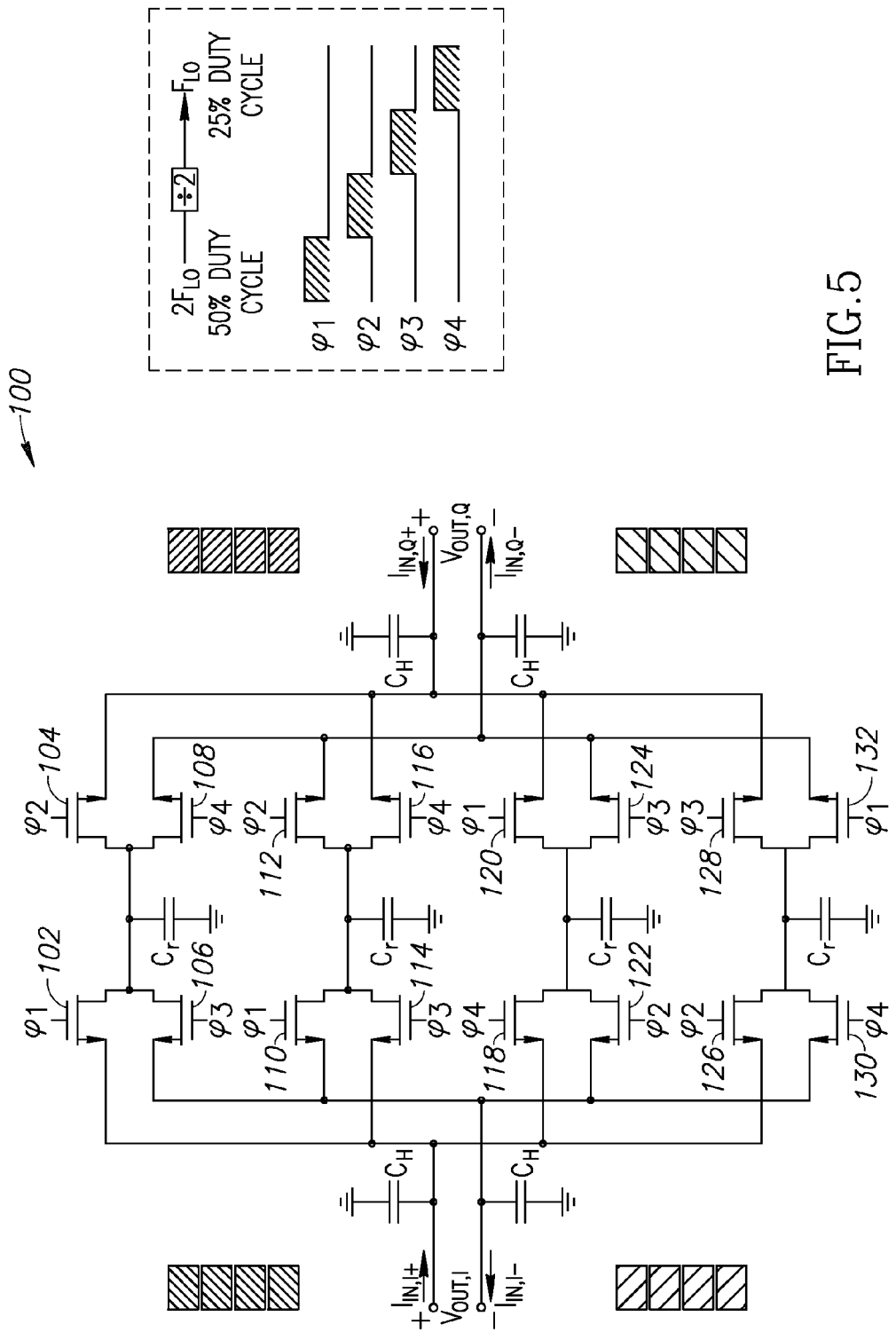
FIG. 5 is a schematic diagram illustrating an initial state of charge sharing between history and rotating capacitors in the wideband IQ charge sharing BPF.
Figure 6:
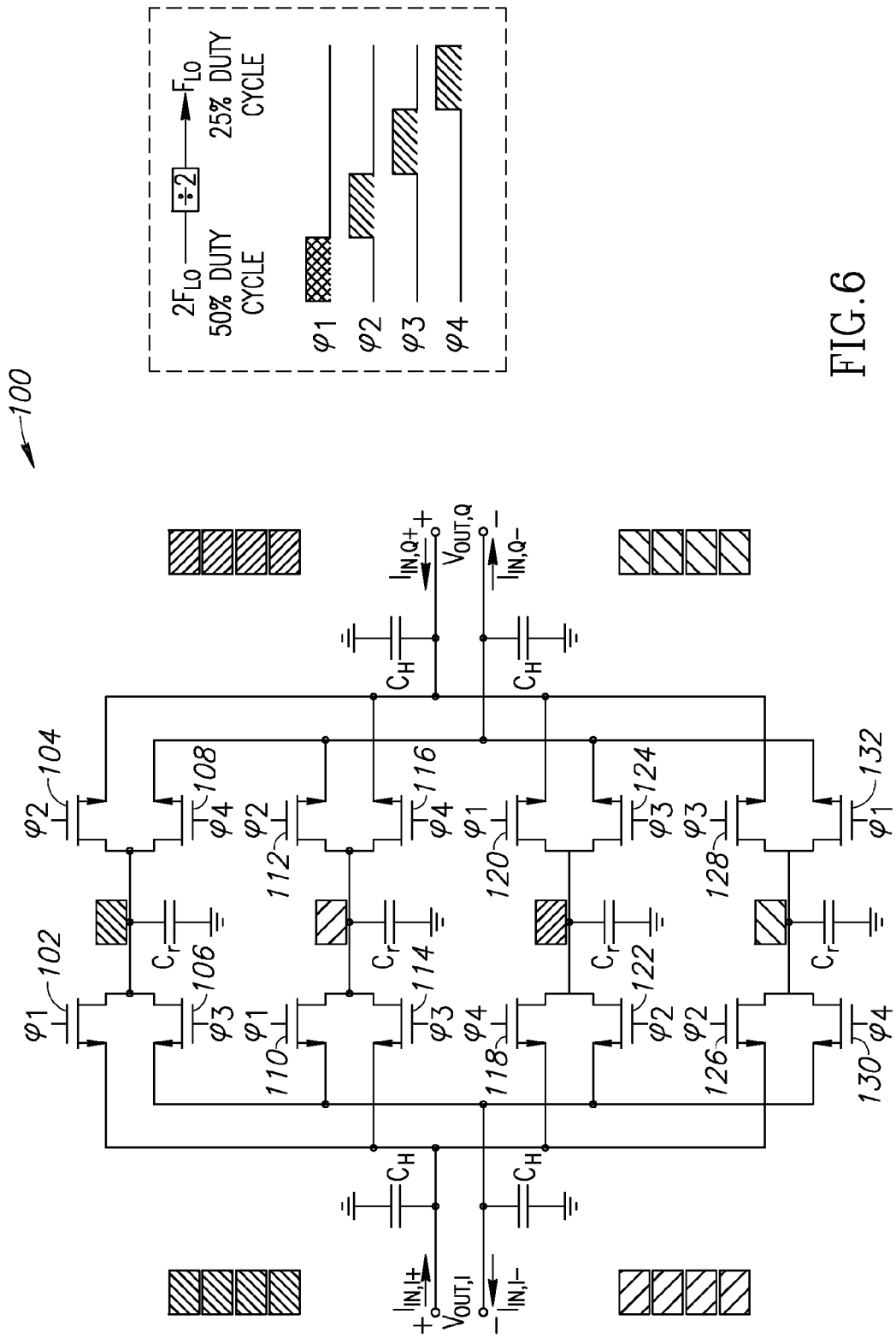
FIG. 6 is a schematic diagram illustrating a first state of charge sharing between history and rotating capacitors in the wideband IQ charge sharing BPF.
Figure 7:
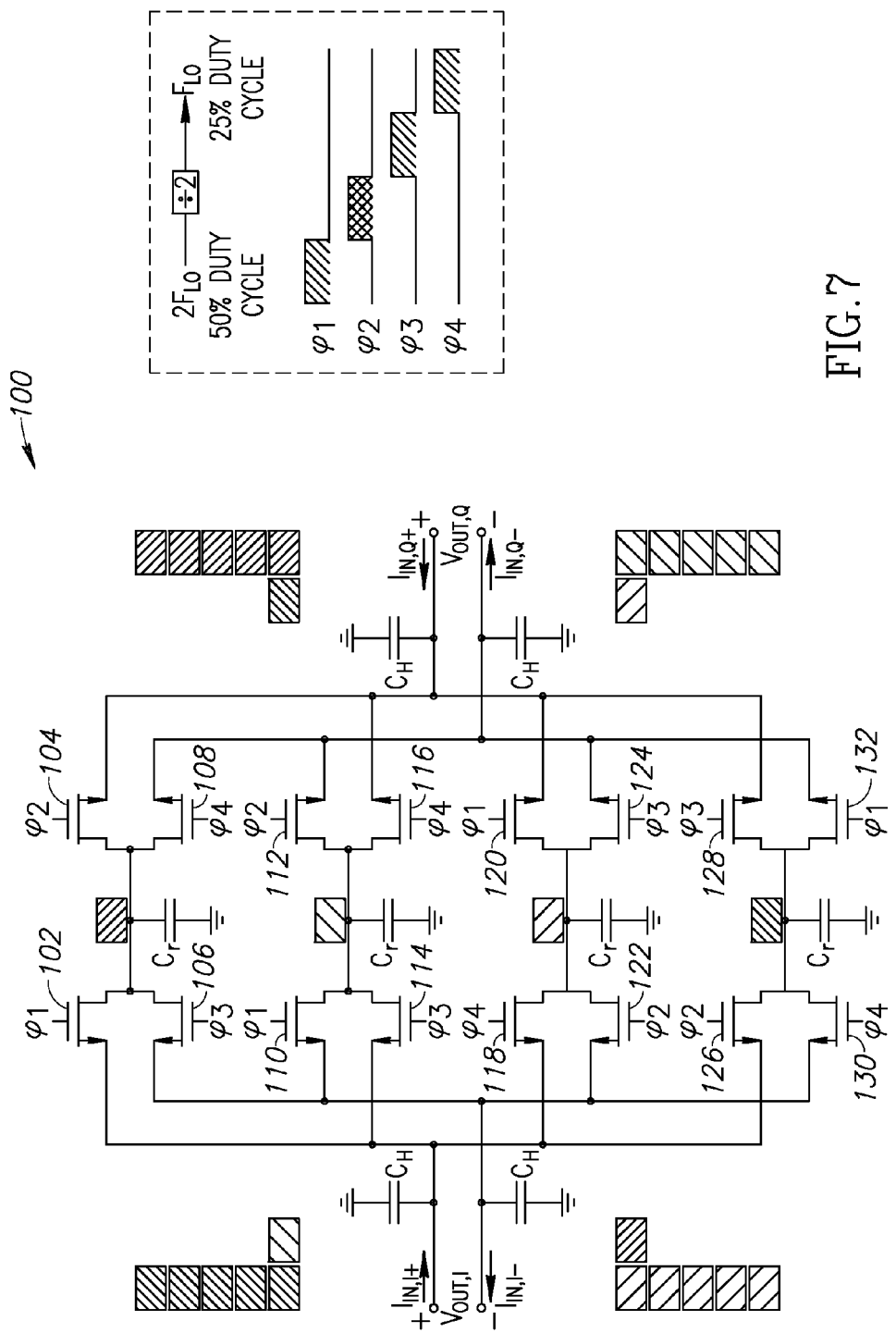
FIG. 7 is a schematic diagram illustrating a second state of charge sharing between history and rotating capacitors in the wideband IQ charge sharing BPF.
Figure 8:
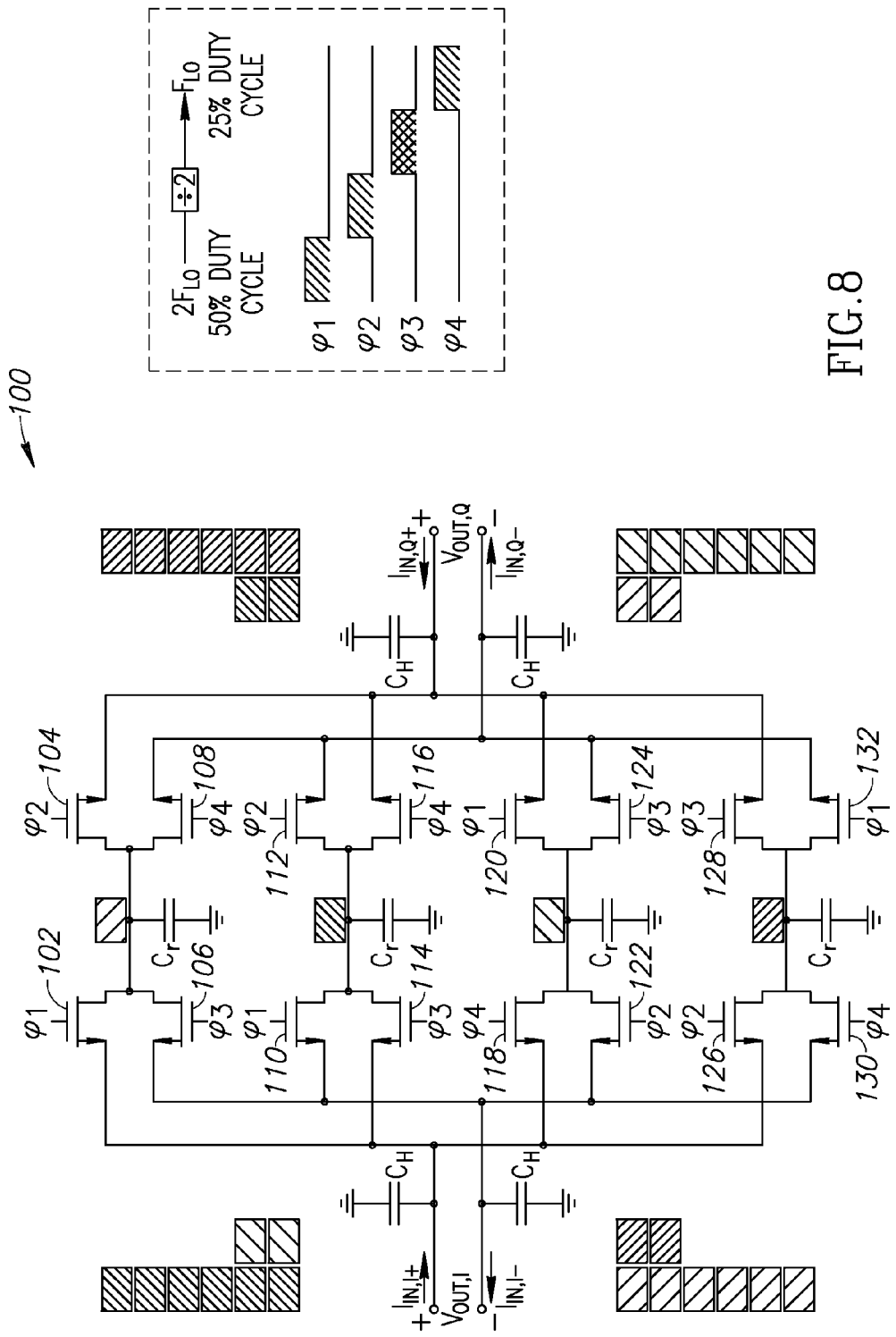
FIG. 8 is a schematic diagram illustrating a third state of charge sharing between history and rotating capacitors in the wideband IQ charge sharing BPF.
Figure 9:
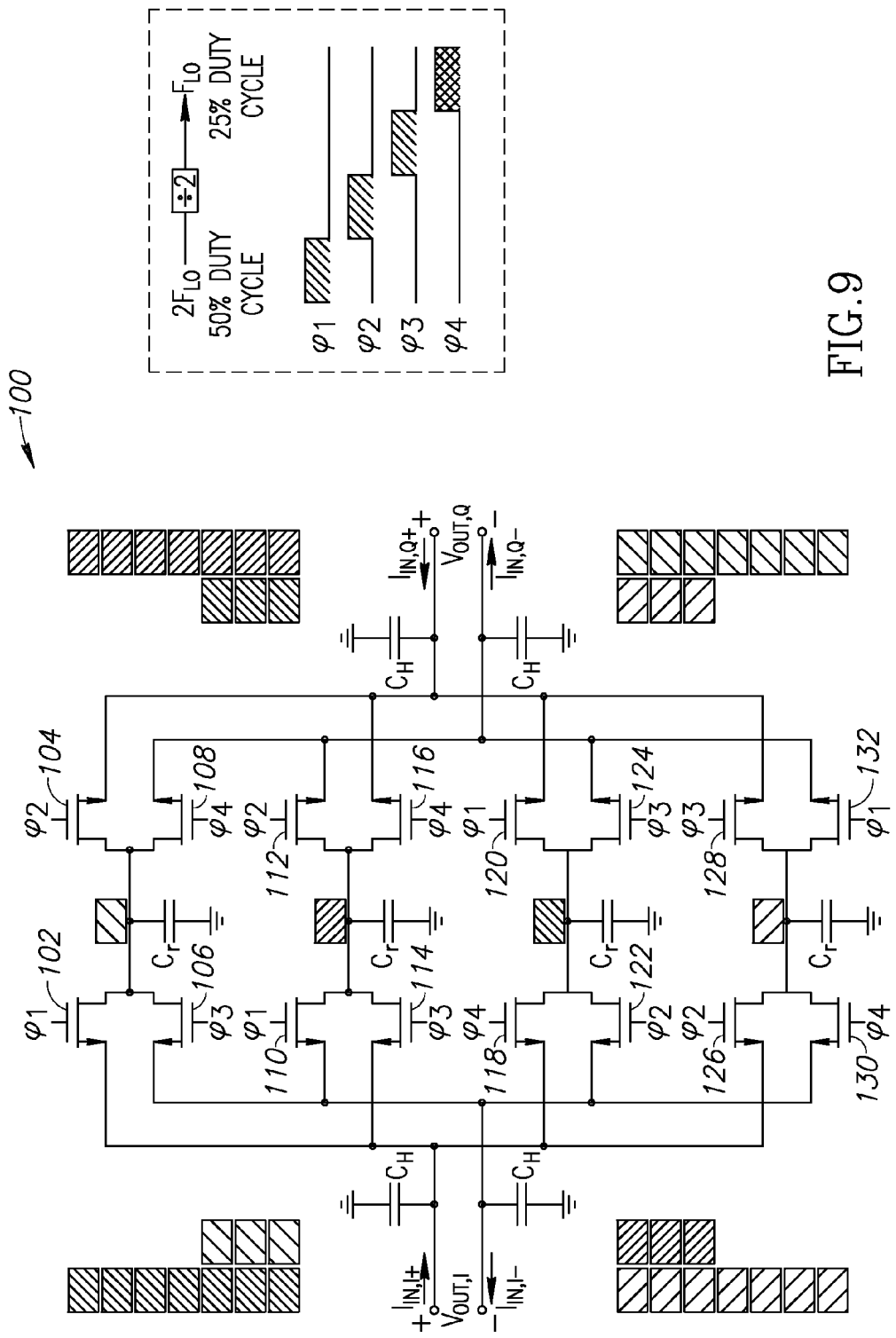
FIG. 9 is a schematic diagram illustrating a fourth state of charge sharing between history and rotating capacitors in the wideband IQ charge sharing BPF.

A schematic diagram illustrating an initial state of charge sharing between history and rotating capacitors in the wideband IQ charge sharing BPF is shown in FIG. 5. The bad pass filter, generally referenced 100, comprises history capacitors $C_H$, rotating capacitors $C_r$, phase 1 transistors 102, 110, 120, 128, phase 2 transistors 104, 112, 122, 126, phase 3 transistors 106, 114, 124, 128, and phase 4 transistors 108, 116, 118, 130. A schematic diagram illustrating a first state of charge sharing between history and rotating capacitors in the wideband IQ charge sharing BPF is shown in FIG. 6. A schematic diagram illustrating a second state of charge sharing between history and rotating capacitors in the wideband IQ charge sharing BPF is shown in FIG. 7. A schematic diagram illustrating a third state of charge sharing between history and rotating capacitors in the wideband IQ charge sharing BPF is shown in FIG. 8. A schematic diagram illustrating a fourth state of charge sharing between history and rotating capacitors in the wideband IQ charge sharing BPF is shown in FIG. 9.

FIGS. 5, 6, 7, 8 and 9 show the concept of IQ charge-sharing wideband BPF. The input current $I_{in,I+}$, $I_{in,I-}$, $Q_{in,Q+}$, $Q_{in,Q-}$ is integrated into the total capacitor $C_t = C_H + C_r$ during four phases of the non-overlapping 25% full-rate local oscillator (LO) clock. The full-rate operation means that it works at the maximum sampling frequency of $4f_{LO}$ to avoid decimation. The main drawback of an early decimation would be an unwanted folding due to the change of the sampling rate between stages. Therefore, in order to avoid aliasing the sampling frequency is maintained at full rate. After each integration of the current into $C_t$ of each quadrature path, a small portion of the total charge $$\frac{c_r}{c_t} Q_{in}$$

is shared between the real and imaginary paths in the next clock cycle. This operation forms a complex filter with a transfer function given by $$H(z) = \frac{V_{out}(z)}{Q_{in}(z)} = \frac{k}{1-(a+jb)z^{-1}} \quad (1)$$

where $k=1/(C_H+C_r)$, $a=C_H/(C_H+C_r)$ and $b=C_r/(C_H+C_r)$. In accordance with Equation 1, the charge-sharing process forms a 1st-order complex filter centered at $$f_c = \frac{f_c}{2\pi}\arctan\frac{b}{a} \quad (2)$$

Therefore, it is possible to adjust the center frequency $f_c$ by changing the coefficients a and b. It is not possible, however, to make the filter very sharp because the discrete time charge sharing is a lossy operation which increases bandwidth of the filter. $f_c$ is slightly sensitive to the capacitance ratio mismatch, as compared with the N-path filter, in which the center frequency is exactly equal to the operating clock frequency. A key advantage of this structure is that the IQ charge-sharing BPF has very robust filtering at frequencies located at $f_s=2$. As a result, it is feasible to use this structure as the wideband BPF centered at $f_{IF}$ to reject image signals located at harmonics of Another benefit of using this filter is that its sampling frequency is equal to $f_s=4$ $f_{LO}$. Therefore, no unwanted image folding occurs as compared to the N-path filter, which suffers from harmonics folding.

The architecture described herein offers several advantages over prior art receivers. The high-IF receiver eliminates the homodyne RX issues described supra, such as LO feed-thorough, dc offset, 1/f noise and 2nd-order nonlinearity, which force all the active devices to be very large. In one embodiment, the gain blocks comprise simple inverter-based $g_m$ stages. All switches and capacitors used in the filters are amenable to technology scaling. In addition, the high-Q BPF of the present invention has a superior image rejection as compared to the N-path filter. In mixer based BPFs, such as the N-path filter, the rejection of the image components is ultimately limited by the mismatch between the LO clock of I and Q paths. On the other hand, there is no inherent limitation in the receiver of the present invention on the level of image component rejection other than the noise figure (NF) degradation and power consumption of LO distribution.

Figure 10:
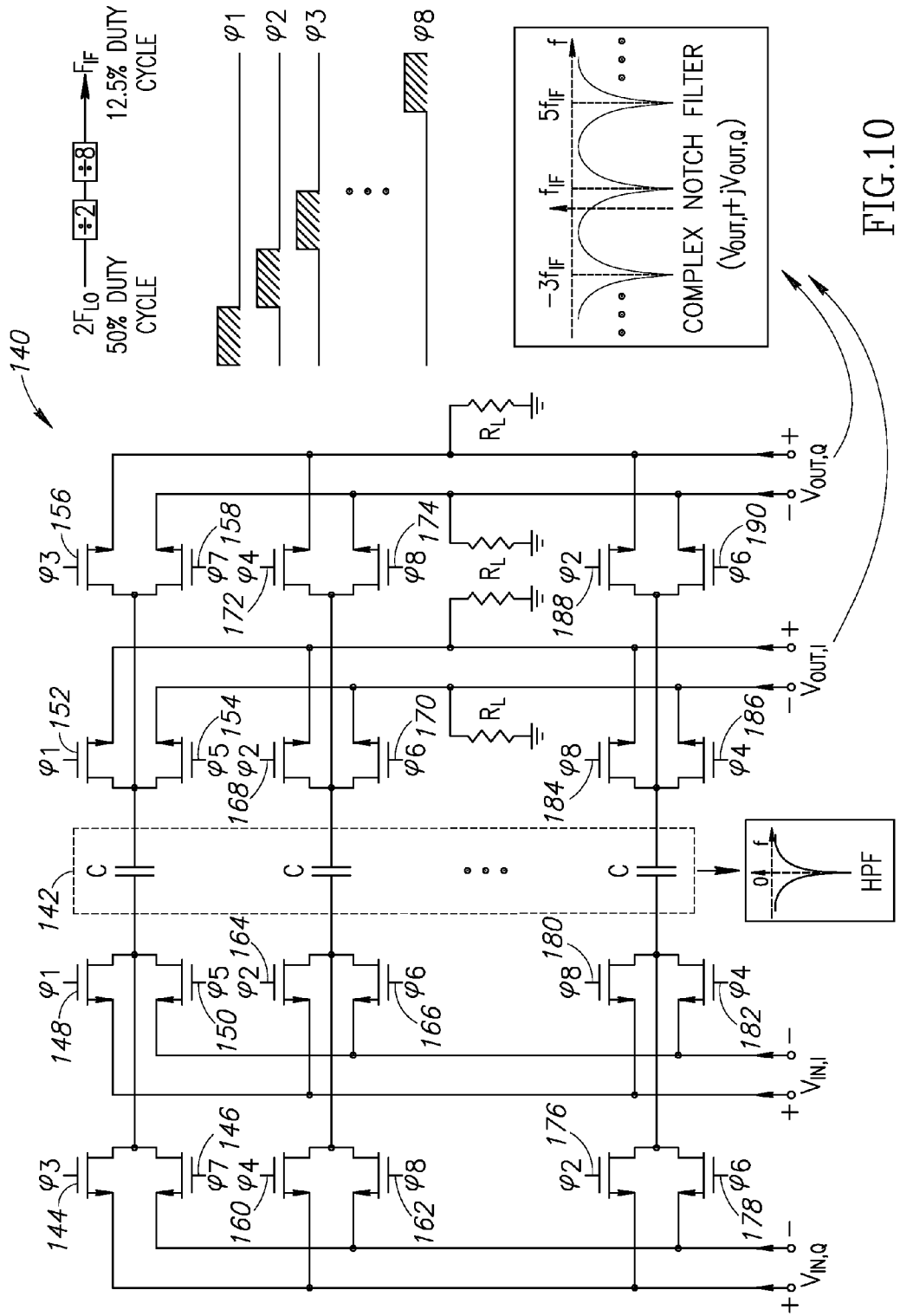
FIG. 10 is a schematic diagram illustrating the complex notch filter of the present invention.
Figure 13:
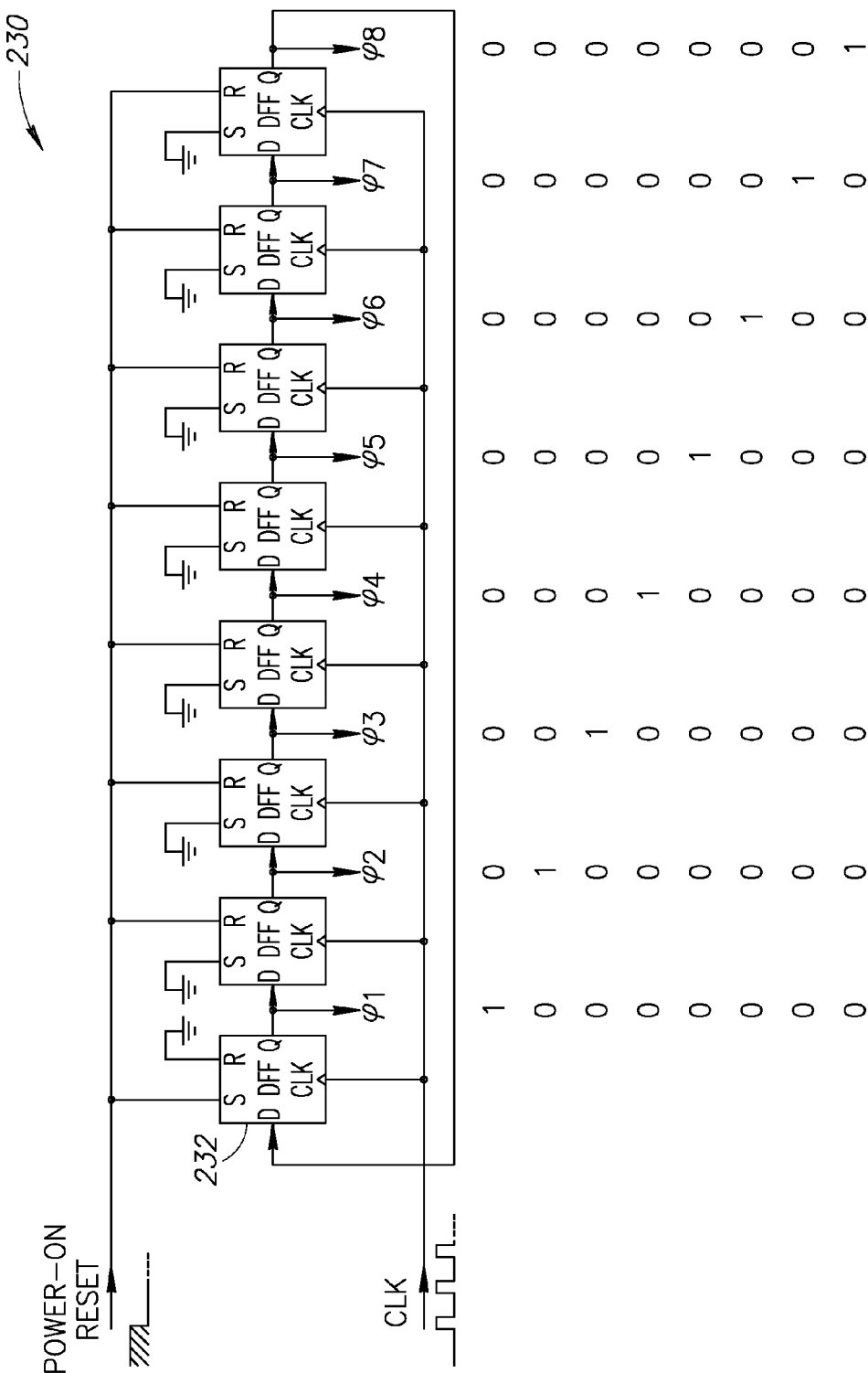
FIG. 13 is a diagram illustrating the IF clock generation circuit in more detail.

A schematic circuit of one embodiment of the on-chip complex notch filter is shown in FIG. 10. The notch filter, generally referenced 140, comprises capacitors C 142, phase 1 transistors 148, 152, phase 2 transistors 164, 168, 176, 188, phase 3 transistors 144, 156, phase 4 transistors 160, 172, 182, 186, phase 5 transistors 150, 154, phase 6 transistors 166, 170, 178, 190, phase 7 transistors 146, 158, phase 8 transistors 162, 174, 180, 184, and resistors $R_L$. The desired signal at $f_{IF}$ is downconverted by the mixers and filtered through the C-R filter which acts as a high pass filter (HPF) at dc. Then, the signal is upconverted to the IF frequency with the second mixer. Similarly to the N-path filter, harmonic mixing might also happen in the N-path notch filter. It is not an issue in this receiver, however, since the image components are already filtered out via the preceding complex wideband IQ charge-sharing filter. The 8-phase clock for the notch filter is generated by dividing the main LO by 2 and then further dividing it by 8, through the chain of ÷2 dividers as shown in FIG. 13. The ÷2 dividers ensure that the 8-phase output clocks are non-overlapped.

Figure 11:
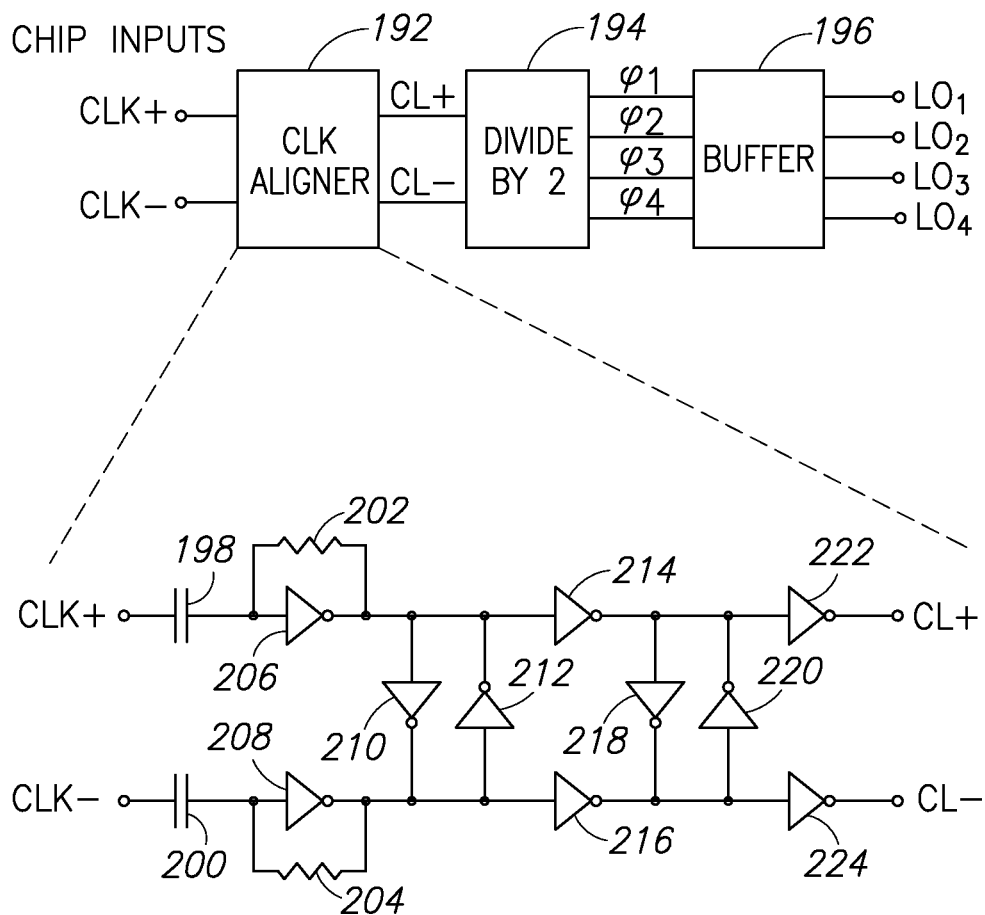
FIG. 11 is a diagram illustrating the clock aligner circuit in more detail.

A diagram illustrating the clock aligner circuit in more detail is shown in FIG. 11. In one embodiment, the clock aligner 192 comprises blocking capacitors 198, 200, resistors 202, 204 and inverters 206, 208, 210, 212, 214, 216, 218, 220, 222, 224.

Figure 12:
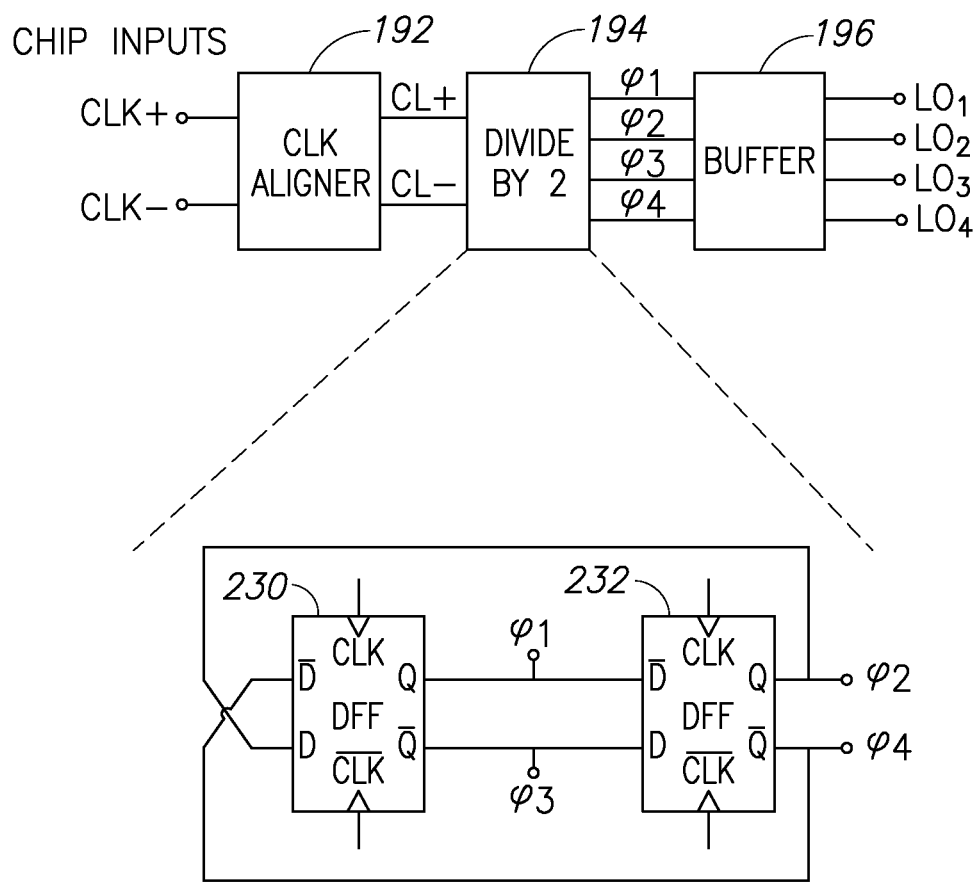
FIG. 12 is a diagram illustrating the clock divider circuit in more detail.

A diagram illustrating the clock divider circuit in more detail is shown in FIG. 12. In one embodiment, the divide by two circuit 194 comprises D flip-flops 230, 232 where the Q output of flip-flop 230 is input to the $\overline{D}$ input of flip-flop 232 and the $\overline{Q}$ output of flip-flop 230 is input to the D input of flip-flop 232. In addition, the Q output of flip-flop 232 is input to the D input of flip-flop 230 and the $\overline{Q}$ output of flip-flop 232 is input to the $\overline{D}$ input of flip-flop 230.

In an example embodiment, the receiver (RX) chip is fabricated in 65 nm CMOS technology. The input signal lies in the range of 500 MHz to 1.2 GHz, corresponding to an IF frequency of 33.33 MHz to 80 MHz. The $C_H$ and $C_r$ capacitors are binary adjustable between 3.8 to 11 pF and 1.2 to 2 pF, respectively. The notch filter capacitance (C in FIG. 10) is 5 pF. The measured RX gain is 35 dB and the noise figure (NF) is 6.7 dB at the maximum gain. The in-band IIP3 is +10 dBm at the 25 dB gain with a two tone test at +5 MHz and +10 MHz; it is 0 dBm at +1 MHz and +2 MHz. The measured RX transfer function at various LO frequencies is demonstrated in FIG. 14. Trace 240 represents the transfer function for an input frequency of 0.8 GHz; trace 242 represents the transfer function for an input frequency of 0.94 GHz; and trace 244 represents the transfer function for an input frequency of 1.1 GHz The notch in the transfer functions is due to the dc blocking capacitors in the feedforward path of the $g_m$ stages shown supra in FIG. 3A.

Figure 14:
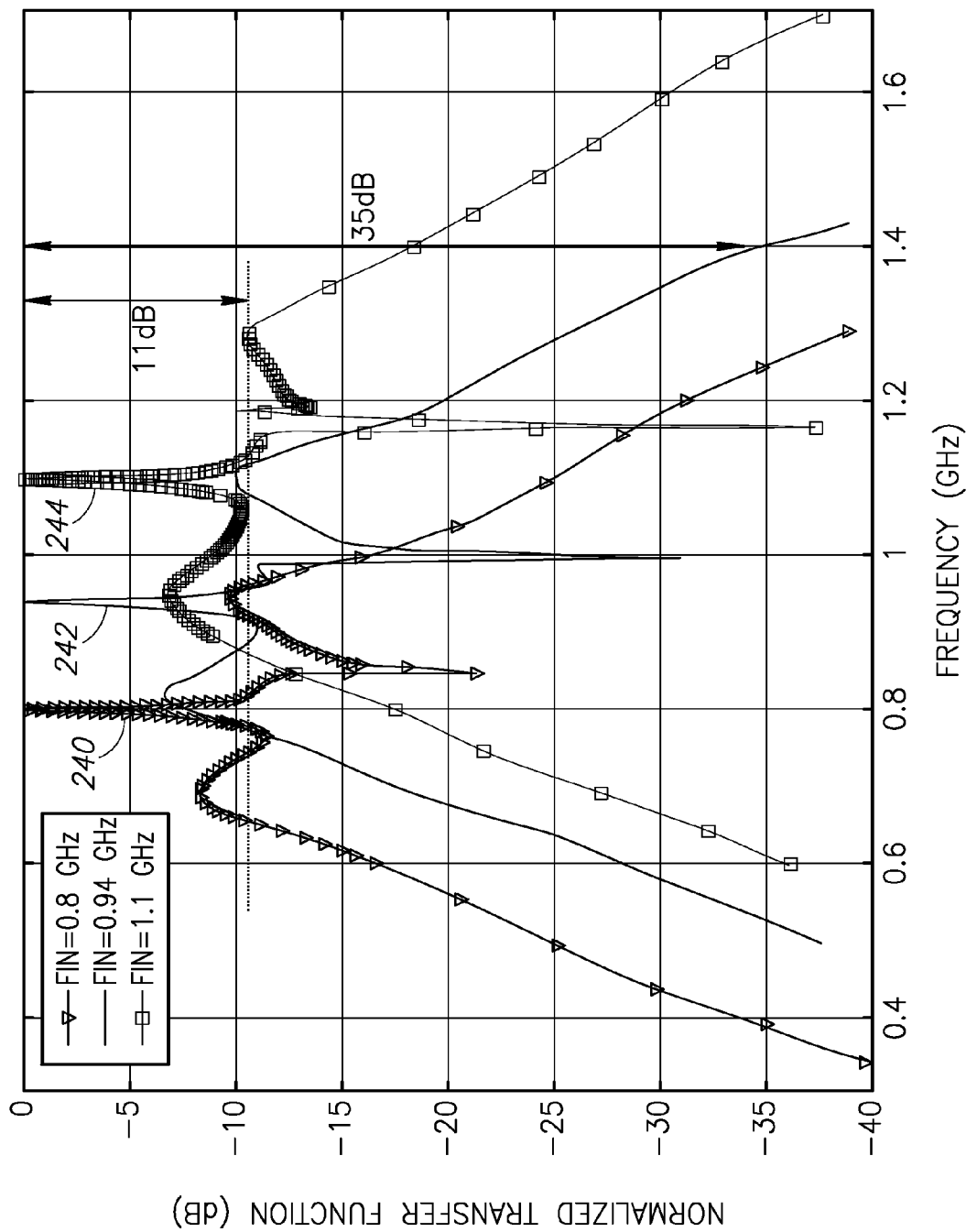
FIG. 14 is a graph illustrating the measured transfer function of the receiver.
Figure 15:
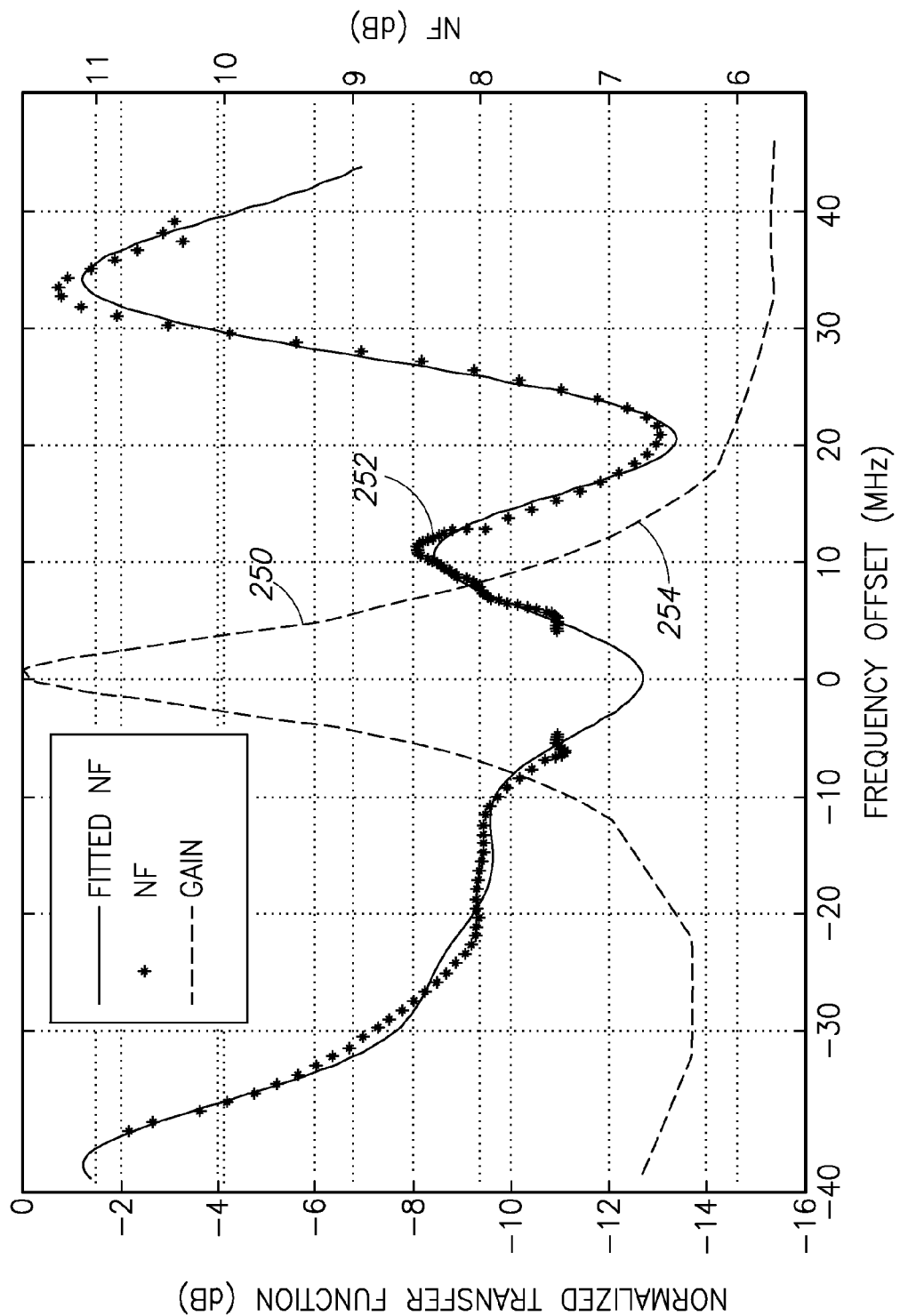
FIG. 15 is a graph illustrating the measured transfer function and noise figure (NF) around the desired RF frequency versus frequency offset.

This further improves IM2 and clock feedthrough. The bandwidth of the receiver is 4.5 MHz. It can be seen that the rejection around the RF frequency is more than 10 dB. The images at $7f_{IF}$ and $9f_{IF}$ could be folded into the wanted signal in the complex notch filter. This is not an issue, however, because these images are already rejected through 35 dB attenuation in the IQ charge-sharing BPF. Note that no pre-select filters are used in the receiver. Therefore, any possible folded images from $7f_{IF}$ and $9f_{IF}$ are first attenuated by 53 dB (35 dB+18 dB). On the other hand, the high-Q N-path filter can be deployed in the feedforward path to improve the filtering function after the IQ charge-sharing BPFs. The two "shoulders" around $f_{RF}$ in FIG. 14 are due to the transition from the filtering function of the sharp high-Q RF band pass filter to the IQ charge sharing band pass filter. A graph illustrating the measured transfer function and noise figure (NF) around the desired RF frequency versus frequency offset shown in FIG. 15. Trace 250 represents the fitted noise figure (NF) in dB; trace 252 represents the noise figure and trace 254 represents the gain in dB. The Q-factor of the band pass filter is 208 and the total power consumption of the receiver is 24.5 mA. A clock generation circuit consumes 6 mA at 1.2V. The active area of the receiver including the clock generation is 0.45 mm$^2$.

The high-IF superheterodyne receiver with high-Q complex band pass filter of the present invention offers superior filtering at RF frequencies (rejects image folding) in addition to strong filtering of the image components while achieving low power consumption in a very small chip area. The technique of impedance combination is utilized to realize a complex high-Q RF band pass filter that rejects image folding that should facilitate the broader adoption of high-IF receiver architectures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

The corresponding structures, materials, acts and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application and to enable others of ordinary skill in the art to understand the invention for various embodiments with various modifications as are suited to the particular use contemplated.

What is claimed is:

1. A superheterodyne radio frequency (RF) receiver, comprising:
   an RF input node for receiving an RF input signal;
   a local oscillator (LO) input node for receiving an LO signal;
   a mixer coupled to said RF input node and said LO input node, said mixer operative to frequency translate said RF input signal in accordance with said LO signal, said mixer producing an in-phase/quadrature (I/Q) intermediate frequency (IF) signal of frequency substantially higher than a bandwidth of said RF input signal;
   a band pass discrete-time (DT) IF filter coupled to said IF signal, wherein said band pass DT IF filter presents an input impedance that is substantially higher at higher frequency offsets from said IF frequency than at lower frequency offsets from said IF frequency.

2. The superheterodyne RF receiver according to claim 1, wherein said band pass DT IF filter comprises a complex charge sharing filter operative to perform charge sharing between said I and said Q signals.

3. The superheterodyne RF receiver according to claim 2, wherein said complex charge sharing filter has a bandwidth substantially at said IF frequency.

4. The superheterodyne RF receiver according to claim 2, wherein said complex charge sharing filter operates at full sampling rate of said LO signal.

5. The superheterodyne RF receiver according to claim 2, wherein said band pass DT IF filter comprises at least one additional complex charge sharing filter cascaded with said complex charge sharing filter.

6. The superheterodyne RF receiver according to claim 2, wherein said band pass DT IF filter comprises a notch filter coupled to said complex charge sharing filter, wherein said notch filter output is coupled to said band pass DT IF filter input.

7. The superheterodyne RF receiver according to claim 1, wherein said band pass DT IF filter comprises a notch filter, wherein said notch filter output is coupled to said band pass DT IF filter input.

8. The superheterodyne RF receiver according to claim 7, wherein said notch filter comprises an N-path filter.

9. A superheterodyne radio frequency (RF) receiver, comprising:
   an RF input node for receiving an RF input signal;
   a local oscillator (LO) input node for receiving an LO signal;
   a mixer coupled to said RF input node and said LO input node, said mixer operative to frequency translate said RF input signal in accordance with said LO signal, said mixer producing an in-phase/quadrature (I/Q) intermediate frequency (IF) signal of frequency substantially higher than a bandwidth of said RF input signal;
   a discrete time (DT) band pass filter coupled to said IF signal and operative to filter out blocking interferer signals and image components of the desired signal;
   a notch filter coupled to the output of said band pass filter and operative to reject wanted signals and pass all blocker and unwanted signals; and
   a feedback loop operative to feedback the output of said notch filter to the input of said band pass filter.

10. The superheterodyne RF receiver according to claim 9, wherein said band pass filter comprises a $3^{rd}$ order complex IQ charge sharing filter.

11. The superheterodyne RF receiver according to claim 9, wherein said notch filter comprises a complex N-path notch filter.

12. The superheterodyne RF receiver according to claim 9, wherein said band pass DT IF filter comprises a complex charge sharing filter operative to perform charge sharing between said I and said Q signals.

13. The superheterodyne RF receiver according to claim 12, wherein said complex charge sharing filter has a bandwidth substantially at said IF frequency.

14. The superheterodyne RF receiver according to claim 12, wherein said complex charge sharing filter operates at full sampling rate of said LO signal.

15. The superheterodyne RF receiver according to claim 12, wherein said band pass DT IF filter comprises at least one additional complex charge sharing filter cascaded with said complex charge sharing filter.

16. A superheterodyne radio frequency (RF) receiver, comprising:

an RF input node for receiving an RF input signal;

a local oscillator (LO) input node for receiving an LO signal;

a mixer coupled to said RF input node and said LO input node, said mixer operative to frequency translate said RF input signal in accordance with said LO signal, said mixer producing an in-phase/quadrature (I/Q) intermediate frequency (IF) signal of frequency substantially higher than a bandwidth of said RF input signal;

a complex IQ charge sharing discrete time (DT) band pass filter centered at said IF coupled to said IF signal and operative to filter out blocking interferer signals and images of the desired signal;

a complex notch filter coupled to the output of said band pass filter and operative to reject wanted signals and pass all blocker and unwanted signals; and a transconductance feedback path operative to feed the output of said notch filter back to the input of said band pass filter.

17. The superheterodyne RF receiver according to claim 16, wherein said band pass filter comprises a $3^{rd}$ order complex IQ charge sharing filter.

18. The superheterodyne RF receiver according to claim 16, wherein said notch filter comprises a complex N-path notch filter.

19. The superheterodyne RF receiver according to claim 16, wherein said complex charge sharing filter operates at full sampling rate of said LO signal.

20. The superheterodyne RF receiver according to claim 16, wherein said receiver comprises one or more gain stages.

21. The superheterodyne RF receiver according to claim 20, wherein said gain stages comprise inverter-based $g_m$ stages.

\* \* \* \* \*